United States Patent Office 2,832,702

Patented Apr. 29, 1958

2,832,702

METHOD OF TREATING SEMICONDUCTOR BODIES FOR TRANSLATING DEVICES

Bertram Schwartz, Los Angeles, Calif., assignor to Hughes Aircraft Company, Culver City, Calif., a corporation of Delaware No Drawing. Application August 18, 1955
Serial No. 529,351

6 Claims. (Cl. 117—200)

This invention relates to fabrication of semiconductor signal translating devices and, more particularly, to the surface treatment of semiconductor crystal bodies for use in such devices.

In the semiconductor art, a region of semiconductor material containing an excess of donor impurities and having an excess of free electrons is considered to be an N-type region, while a P-type region is one containing an excess of acceptor impurities resulting in a deficit of electrons, or stated differently, an excess of holes. When a continuous solid specimen of semiconductor material has an N-type region adjacent a P-type region, the boundary between the two regions is termed a P–N (or N–P) junction and the specimen of semiconductor material is termed a P–N junction semiconductor device. Such a P–N junction device may be used as a rectifier. A specimen having two N-type regions separated by a P-type region, for example, is termed an N–P–N junction semiconductor device or transistor, while a specimen having two P-type regions separated by an N-type region is termed a P–N–P junction semiconductor device or transistor.

As is now well known to the art, germanium and silicon crystal bodies are used in semiconductor translating devices, such as rectifiers, transistors, and photocells. It is also known to the art that the semiconductor devices are adversely affected by the presence of moisture on the surface of the semiconductor crystal body. Various means have been utilized, therefore, to render the crystal impervious to moisture which may precipitate or deposit upon exposure of the semiconductor body to ambient conditions, or by other causes. The most common prior method of rendering the surface of the semiconductor body moisture resistant is by coating the surface of the body with silicone varnish and baking the body at an elevated temperature for an extended period of time. For example, the common baking procedure after application of the silicone varnish is to bake the crystal body for a period of four hours at a temperature of 300° C. This method has several limitations and disadvantages in production processes, however, and such an extended baking period does not lend itself to mass production techniques.

Accordingly, it is an object of the present invention to provide a method of treating the surfaces of a semiconductor body to render the surface moisture resistant.

It is another object of the present invention to render the surfaces of a semiconductor body moisture resistant without subjecting the body to damaging temperature conditions.

It is another object of the present invention to provide a thermally stable moisture resistant film on semiconductor bodies.

It is another object of the present invention to provide a method of surface treatment of semiconductor bodies which is less time consuming than methods heretofore known to the art and which lends itself readily to mass production.

It is a further object of the present invention to provide a method of surface treatment of semiconductor crystal bodies which results in clearly defined P–N junctions in junction type semiconductor devices.

A still further object of the present invention is to provide a method of surface treatment for semiconductor crystal bodies which results in improved electrical characteristics of semiconductor devices utilizing the semiconductor bodies.

The method of the present invention comprises the polymerization of a water hydrolyzable organo substituted silane into a silicone water resistant film on the surface of the semiconductor body after the semiconductor body has been etched by methods well known to the art.

The novel features which are believed to be characteristic of the invention, both as to its organization and method of operation, together with further objects and advantages thereof, will be better understood from the following description in which a presently preferred embodiment of the invention is described by way of example.

In accordance with an illustrative embodiment of the present invention, a silicon crystal which has been cut and lapped to the desired dimensions is etched by methods well known to the art. For example, in the presently preferred embodiment, the etching step is carried out by immersing the silicon body for approximately 30 seconds in a solution containing equal parts of nitric acid, hydrochloric acid and acetic acid. The silicon body is then rinsed in distilled water, boiled in a 50/50 mixture of acetone and methyl alcohol, and rinsed in absolute methyl alcohol.

After etching as described above, the surfaces of the crystal body are moistened by immersing the body in water and then drying with filter paper to remove excess water. Since the reaction between water and organo substituted silanes causes polymerization of the silane, more uniform results are obtained in surface treatment when moisture is present on the surface. Visible condensed water, however, should be removed since its presence causes the formation of thick non-uniform patches of the surface coating which is applied as described hereinafter.

A water hydrolyzable organo-substituted silane is then applied to all surfaces of the silicon body. In this embodiment this is accomplished by immersing the silicon body in the organo-substituted silane liquid. The silicon body is left in the liquid for a sufficient length of time to cause complete wetting of all surfaces. For example, one minute is an illustrative length of time. For the most uniform results the liquid silane is agitated to cause complete wetting of the silicon surfaces by the silane. Excellent results have been achieved by using ultrasonic agitation. In the presently preferred embodiment a mixture of organo-substituted chlorosilane is used which is a mixture containing equal parts of methyltrichlorosilane and dimethyldichlorosilane. The use of this mixture as the water hydrolyzable organo chloro-substituted silane liquid furnishes space polymerization and maximum bonding of silicone molecules to the silicon surface. The reaction of the dimethyldichlorosilane and methyltrichlorosilane with moisture which is adsorbed on the surface of the silicon body causes hydrochloric acid to be split off and leaves a thin water repellent film of silicone polymer which adheres to the silicon surface. The organic groups present in the silicone polymer, which are methyl groups in the presently preferred embodiment, furnish a hydrophobic surface which resists wetting by moisture. The mixture of dimethyldichlorosilane and methyltrichlorosilane results in excellent surface treatment of the silicon crystal since the methyltrichlorosilane furnishes a spatial 3-dimensional polymerization chain for good bonding and complete coverage of the silicon surface, while the dimethyldichlorosilane supplies a maximum number of organic methyl groups for good moisture repellency. In addition, the chemical bond between silicon atoms and carbon atoms in the silicone polymer is strong, resulting in good thermal stability of the film.

It will be apparent to one skilled in the art that although a 50/50 mixture of dimethyldichlorosilane and methyltrichlorosilane has been described in the illustrative embodiment, the proportion of the two compounds in the organo-substituted silane liquid is not critical and is dependent only upon having methyl groups present in sufficient quantity to furnish water repellency in the film. For example, a mixture containing from approximately 10 percent to 90 percent of methyltrichlorosilane and from approximately 90 percent to 10 percent of dimethyldichlorosilane yields good results, while satisfactory results are obtained when either dimethyldichlorosilane or methyltrichlorosilane is used alone as the organo-substituted silane liquid.

The thickness of the water repellent film which is formed on the silicon surface is very thin, being of the order of approximately $6\times10^{-5}$ centimeters. For some applications, a film of less thickness may be allowable, or in some instances may be necessary. In such a case the thickness of the film may be decreased by diluting the silane liquid with as much as 90 percent of an organic solvent such as trichloroethylene.

After complete wetting of all surfaces of the silicon crystal has been achieved, the silicon crystal is removed from the water hydrolyzable organo-substituted silane liquid and baked to drive off all volatile materials, complete the polymerization of the silane, and strengthen the bond between the silicone polymer and the surface of the silicon crystal. In the presently preferred embodiment, for example, baking for approximately two hours at 100° C. or one hour at 300° C. accomplishes these results.

Although the present invention has been described with particular reference to the surface treatment of silicon crystals, germanium crystals and alloys of silicon and germanium may also be treated in accordance with this invention to obtain water repellency and improved electrical characteristics.

Although dimethyldichlorosilane and methyltrichlorosilane have been described as the presently preferred silane liquid, other water hydrolyzable organo-substituted silanes—such as vinyltrichlorosilane, diethyldichlorosilane, ethyltrichlorosilane and triethoxymonohydrogensilane—may also be used. In all cases the organic group in the resulting silicone polymer will furnish the water repellency. By using these organo-substituted chlorosilanes, hydrochloric acid will again be split off in the presence of moisture and a silicone polymer film will cover the surfaces of the semiconductor body which is being treated. Ethoxy-substituted silanes may also be used and have been found to be particularly advantageous in the surface treatment of germanium crystal bodies. In this instance, by using triethoxymonohydrogensilane as the organo-substituted silane liquid in the method of surface treatment described hereinbefore, $C_2H_5OH$ will be split off upon polymerization and the organic groups in the resulting silicone polymer film will furnish the water repellency.

In addition to obtaining a thermally stable water repellent film upon the semiconductor crystal body, the surface treatment described herein also yields improved electrical characteristics in semiconductor devices which are constructed by utilizing semiconductor crystal bodies which have been so treated. It has been found that when a semiconductor crystal body, such as silicon, having a P–N junction formed therein, is etched and exposed to ambient conditions, an effect known as the "channel effect" is encountered which produces poorly defined P–N junctions. Although the theory behind the channel effect in P–N junctions is not clearly understood, it has been found that the surface treatment described herein eliminates such an effect and thereby maintains a clearly-defined P–N junction within the semiconductor body. Semiconductor devices utilizing semiconductor bodies in accordance with the present invention have improved saturation current characteristics and exhibit higher and harder peak inverse voltage characteristics. Further, the leakage across the surface of devices which are so treated is eliminated due to the high surface resistance.

Although the silane film is applied to the semiconductor body by immersion of the body in the silane liquid in this illustrative embodiment, it may also be applied by entraining the silane in vapor form and causing the entrained vapor to be passed over the surfaces of the semiconductor body.

Thus, the present invention provides a method and means for the surface treatment of semiconductor crystal bodies which results in the formation of a moisture repellent film upon the crystal bodies, together with improved electrical characteristics of the semiconductor body, without subjecting the body to damaging temperatures or ambient conditions.

What is claimed is:

1. The method of surface treatment of a semiconductor crystal body containing minute particles of water for use in a semiconductor signal translating device which comprises etching a surface of said semiconductor crystal body, moistening said surface with water, immersing said surface in a solution of water hydrolyzable organo-substituted silane, removing said crystal body from said solution, and heating said body to a predetermined temperature sufficient to boil off the volatile compounds which remain after the polymerization of the organo-substituted silane.

2. The method of surface treatment of a silicon body containing minute particles of water for use in a semiconductor signal translating device which comprises etching a surface of said silicon body, moistening said surface with water, immersing said surface in a solution of water hydrolyzable organo-substituted silane, removing said silicon body from said solution, and heating said body to a predetermined temperature sufficient to boil off the volatile compounds which remain after the polymerization of the organo-substituted chlorosilane.

3. The method of surface treatment of a semiconductor body for use in a semiconductor signal translating device which comprises etching a surface of said semiconductor body, moistening said surface of said semiconductor body, immersing said surface in a mixture comprising dimethyldichlorosilane and methyltrichlorosilane, removing said semiconductor body from said mixture, and baking said semiconductor body, whereby all volatile compounds are removed from said surface after the polymerization of said dimethyldichlorosilane and methyltrichlorosilane.

4. The method of surface treatment of a silicon body for use in a semiconductor signal translating device which comprises etching a surface of said silicon body, moistening said surface of said silicon body, immersing said surface in a mixture comprising dimethyldichlorosilane and methyltrichlorosilane, removing said silicon body from said mixture, and baking said silicon body, whereby all volatile compounds are removed from said surface after the polymerization of said dimethyldichlorosilane and methyltrichlorosilane.

5. The method of surface treatment of a silicon body for use in a semiconductor signal translating device comprising etching the surfaces of said silicon body, immersing said silicon body in water, removing said silicon body from said water, drying said surfaces to remove excess water therefrom, immersing said silicon body in a solution comprising from approximately 10% to 90% of dichlorodimethylsilane and from approximately 90% to 10% methyltrichlorosilane, removing said silicon body from said solution, and baking said silicon body, whereby volatile compounds are removed from said surface after the polymerization of said dimethyldichlorosilane and methyltrichlorosilane.

6. The method of surface treatment of a silicon body for use in a semiconductor signal translating device comprising etching the surfaces of said silicon body, immersing said silicon body in water, removing said silicon body from said water, drying said surfaces to remove excess water therefrom, immersing said silicon body in a solution comprising approximately equal parts of dichlorodimethylsilane and methyltrichlorosilane, removing said silicon body from said solution, and baking said silicon body, whereby volatile compounds are removed from said surface after the polymerization of said dimethyldichlorosilane and methyltrichlorosilane.

References Cited in the file of this patent

UNITED STATES PATENTS

| | | |
|---|---|---|
| 2,306,222 | Patnode | Dec. 22, 1942 |
| 2,408,822 | Tanis | Oct. 8, 1946 |
| 2,743,201 | Johnson et al. | Apr. 24, 1956 |

FOREIGN PATENTS

| | | |
|---|---|---|
| 157,562 | Australia | July 8, 1954 |